(12) United States Patent
Labonté et al.

(10) Patent No.: US 8,507,375 B1
(45) Date of Patent: Aug. 13, 2013

(54) ALIGNMENT TOLERANT SEMICONDUCTOR CONTACT AND METHOD

(75) Inventors: André P. Labonté, Scarborough, ME (US); Richard S. Wise, Ridgefield, CT (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/364,976

(22) Filed: Feb. 2, 2012

(51) Int. Cl.
*H01L 21/44* (2006.01)

(52) U.S. Cl.
USPC ............ 438/597; 257/E21.507; 257/E21.627; 257/E21.641; 257/E21.658; 438/98; 438/233; 438/256; 438/523; 438/533; 438/571; 438/586; 438/621; 438/666

(58) Field of Classification Search
USPC .................. 257/E21.507, E21.627, E21.641, 257/E21.658; 438/571, 586, 597, 621, 666
See application file for complete search history.

(56) References Cited

U.S. PATENT DOCUMENTS

| | | | | |
|---|---|---|---|---|
| 5,672,535 A | * | 9/1997 | Shrivastava et al. | 438/396 |
| 5,920,780 A | * | 7/1999 | Wu | 438/301 |
| 6,413,846 B1 | * | 7/2002 | Besser et al. | 438/597 |
| 7,517,767 B2 | * | 4/2009 | Dyer et al. | 438/303 |
| 8,324,058 B2 | * | 12/2012 | Cheng et al. | 438/294 |
| 2002/0009866 A1 | * | 1/2002 | Jang et al. | 438/586 |
| 2002/0016053 A1 | * | 2/2002 | Kerr et al. | 438/597 |
| 2002/0045332 A1 | * | 4/2002 | Jang et al. | 438/585 |
| 2003/0049921 A1 | * | 3/2003 | Hu | 438/597 |
| 2004/0043592 A1 | * | 3/2004 | Goodwin et al. | 438/586 |
| 2007/0249151 A1 | * | 10/2007 | Kadoya | 438/597 |
| 2008/0029836 A1 | * | 2/2008 | Zhu | 257/412 |
| 2011/0193144 A1 | * | 8/2011 | Sun et al. | 257/288 |
| 2012/0112252 A1 | * | 5/2012 | Yin et al. | 257/288 |
| 2012/0146106 A1 | * | 6/2012 | Richter et al. | 257/288 |
| 2012/0248508 A1 | * | 10/2012 | Ponoth et al. | 257/288 |

* cited by examiner

*Primary Examiner* — Asok K Sarkar
(74) *Attorney, Agent, or Firm* — Ingrassia Fisher & Lorenz, P.C.

(57) ABSTRACT

An alignment tolerant electrical contact is formed by providing a substrate on which is a first electrically conductive region (e.g., a MOSFET gate) having an upper surface, the first electrically conductive region being laterally bounded by a first dielectric region, applying a mask having an opening extending partly over a contact region (e.g., for the MOSFET source or drain) on the substrate and over a part of the upper surface, forming a passage through the first dielectric region extending to the contact region and the part of the upper surface, thereby exposing the contact region and the part of the upper surface, converting the part of the upper surface to a second dielectric region and filling the opening with a conductor making electrical contact with the contact region but electrically insulated from the electrically conductive region by the second dielectric region.

16 Claims, 4 Drawing Sheets

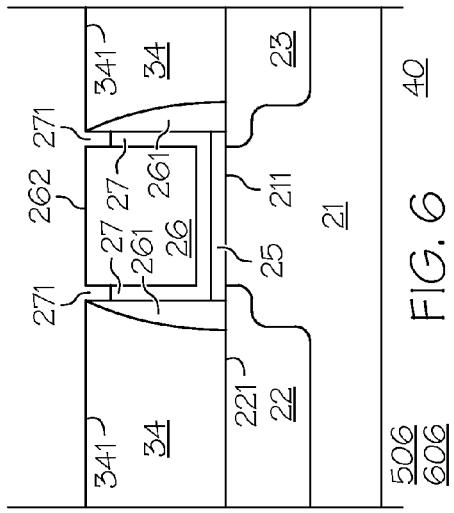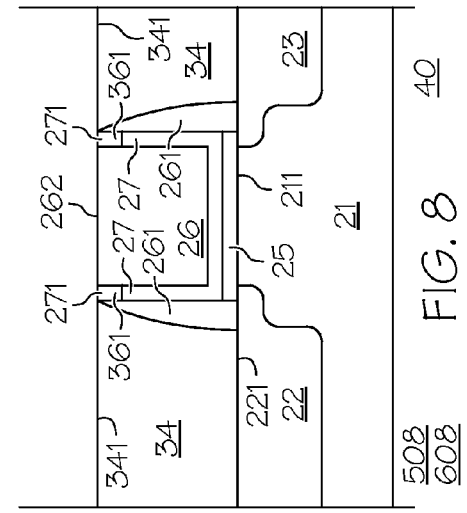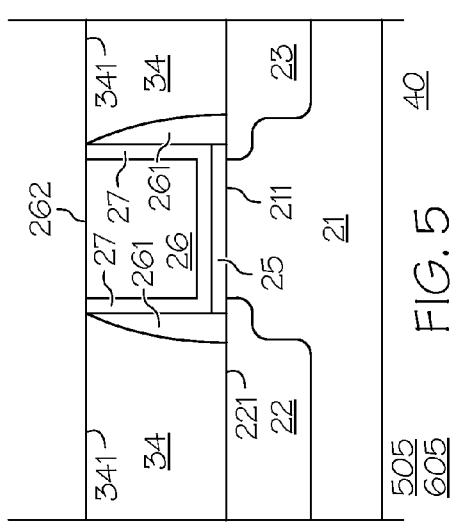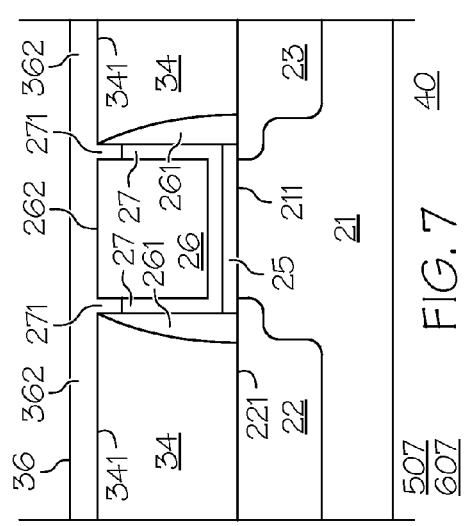

ALIGNMENT TOLERANT SEMICONDUCTOR CONTACT AND METHOD

FIELD OF THE INVENTION

This invention relates generally to methods and structures for forming semiconductor devices and integrated circuits (ICs) incorporating contacts, especially contacts in close proximity to other device regions intended to be electrically insulated from such contacts.

BACKGROUND OF THE INVENTION

It is very common in the semiconductor (SC) device and integrated circuit (IC) arts to place contacts to a semiconductor (SC) body or layer in close proximity to other device regions that must remain substantially insulated from such contacts. A well known example is source and/or drain (S-D) contacts of field effect transistors (FETs). The S-D contacts are electrical conductors that provide Ohmic electrical connections to underlying source and/or drain regions of a FET. Such source-drain (S-D) contacts are generally desired to be laterally very close to but insulated from a gate conductor that overlies and is insulated from the portion of the semiconductor body or layer between the source and drain regions. When the gate conductor is appropriately biased with respect to the S-D contacts and the S-D regions, it creates a conductive channel extending between such S-D regions. It is this controllable conductive channel that gives rise to the desirable properties of such FETs and of the ICs made up of multiple interconnected FETs.

There is an ongoing need to provide ever denser and more complex SC devices and ICs. This is accomplished in part by reducing the dimensions and spacing of the various device regions. The spacing and alignment of the various device regions are generally determined lithographically, that is by using doping, deposition and/or etching masks. However, as dimensions of the various mask openings and the spacing of such openings become smaller and smaller, alignment tolerance and other errors inherent in the photo-lithographic process become more and more significant and can adversely affect manufacturing yield and cost. Thus, there is an ongoing need to provide contacts closely spaced to but insulated from other device regions or elements where the structure and process used to form such contacts are more tolerant of inherent errors in contact alignment, placement and/or size. This is especially important in connection with field effect transistors (FETs) but also applies to many other semiconductor devices and ICs where contacts must be placed in close proximity to but insulated from other electrical conductors or device regions. Accordingly, the present invention is not limited to FETs but applies generally to any type of semiconductor devices and ICs where such closely spaced contacts are needed.

BRIEF SUMMARY OF THE INVENTION

An integrated circuit with an alignment tolerant electrical contact (44) is formed by providing a substrate (21) with a first electrically conductive region (26) (e.g., a MOSFET gate) having an upper surface (262), wherein the electrically conductive region is laterally bounded by a first dielectric region (34), applying a mask having an opening (301) extending partly over a contact region (221) of the substrate (21) (e.g., for the MOSFET source or drain (22)) and over a part (263) of the upper surface (262), forming a passage (342) through the first dielectric region (34) extending to the contact region (221) and the part (263) of the upper surface (262), thereby exposing the contact region (221) and the part (263) of the upper surface (262), converting the part (263) of the upper surface (262) to a second dielectric region (264) and filling the passage (342) with a conductor (44) making electrical contact with the contact region (221) but electrically insulated from the electrically conductive region (26) by the second dielectric region (264).

BRIEF DESCRIPTION OF THE DRAWINGS

The invention will be better understood from a reading of the following detailed description, taken in conjunction with the accompanying figures in the drawings in which like numerals denote like or analogous elements, and wherein:

FIGS. 5-14 show simplified cross-sectional views of a semiconductor device or portion of an IC embodying a FET analogous to that of FIGS. 1-4 at various manufacturing stages and with the same contact mis-alignment or mis-placement shown in FIG. 3, but where the contact-gate short illustrated in FIG. 4 is avoided, according to an embodiment of the invention.

DETAILED DESCRIPTION OF THE INVENTION

Figure 1:
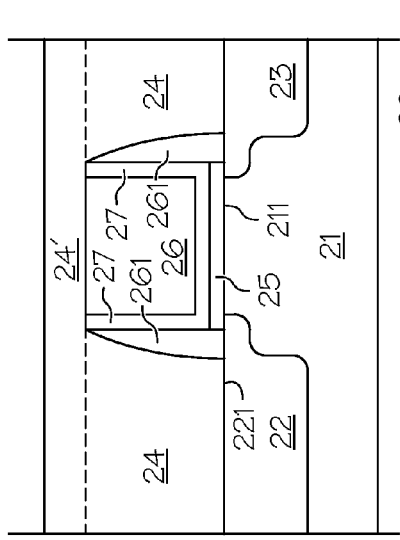
FIGS. 1-4 show simplified cross-sectional views of a semiconductor device or portion of an integrated circuit (IC) embodying a FET whose source or drain contact is intended to be located in close proximity to but insulated from an adjacent conductive gate, illustrating how contact mis-alignment or mis-placement can result in an unintended short between the contact and the gate of the FET.

The following detailed description is merely exemplary in nature and is not intended to limit the invention or the application and uses of the invention. Furthermore, there is no intention to be bound by any expressed or implied theory presented in the preceding technical field, background, or the following detailed description. For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "comprise," "include," "have" and any variations thereof used herein, are intended to cover non-exclusive inclusions, such that a process, method, article, or apparatus that "comprises" or "includes" or has a list of elements or steps is not necessarily limited to those elements or steps, but may include other elements or steps not expressly listed or inherent to such process, method, article, or apparatus. As used herein the terms "substantial" and "substantially" mean sufficient to accomplish the stated purpose in a practical manner and that minor imperfections, if any, are not significant for the stated purpose. Furthermore, the terms "first," "second," "third," and the like in the description and the claims, if any, may be used for distinguishing between somewhat similar elements and not necessarily for describing a particular spatial arrangement or sequence or chronological order. It is to be understood that the terms so used are interchangeable under appropriate circumstances such that the embodiments of the invention described herein are, for example, capable of operation or fabrication in sequences, orientations and arrangements other than those illustrated or otherwise described herein.

Metal-oxide-semiconductor (MOS) devices are a well known form of field effect transistors (FETs). Complimentary metal-oxide-semiconductor (CMOS) devices, that is, with both P-channel (PMOS) and N-channel (NMOS) devices, are much used in integrated circuits (ICs). The term metal-oxide-semiconductor and the abbreviation "MOS" are widely used in the art to refer to insulated gate field effect transistors or devices (IGFETs) irrespective of whether they employ metals or some other form of conductor for the gates of such devices, and irrespective of whether they use oxides or some other form of dielectrics for the gate insulators. Semiconductors, doped semiconductors, metals, metal alloys, metal-semiconductor alloys, semi-metals and combinations thereof are non-limiting examples of suitable gate conductors. Oxides, nitrides, fluorides, combinations thereof and other inorganic and organic dielectrics are non-limiting examples of suitable gate insulators. Accordingly, the terms metal-oxide-semiconductor and the abbreviations MOS, MOSFET, PMOS, PFET, NMOS NFET and CMOS as used herein are intended to refer broadly to such insulated gate field effect transistors or devices and not be limited merely to those employing just metals and/or just oxides.

For convenience of explanation, embodiments of the invention are described herein for MOSFETs employing silicon (Si) semiconductors. However, persons of skill in the art will understand that the invention is not limited merely to Si semiconductors, but also applies to other semiconductor materials and other types of SC devices where electrical contacts closely spaced to but electrically insulated from other device regions are needed. Further, as used herein, the term "semiconductor" and the abbreviation "SC", singular or plural, are intended to include any kind of semiconductor material, including but not limited to single crystal semiconductors, polycrystalline semiconductors, amorphous semiconductors as well as organic and inorganic semiconductors. As used herein, the term "substrate", singular or plural is intended to include bulk semiconductor substrates, semiconductor layers, insulating substrates, and combinations thereof, such as but not intended to be limiting, semiconductor-on-insulator (SOI) substrates and insulator-on-semiconductor (IOS) substrates. Substrates may be single crystal, polycrystalline, amorphous, laminated or combinations thereof. For convenience of description, various conductors may be referred to as "metals", but unless indicated otherwise by the particular context, the words "metal" and "conductor", singular or plural, should be interpreted broadly to include any type of electrical conductor, whether metallic or not.

Figure 2:
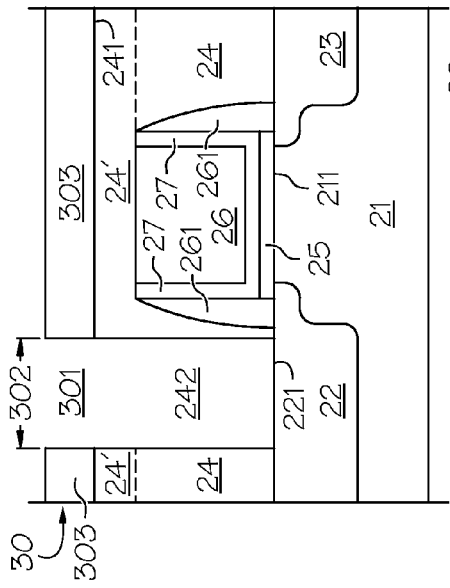
Figure 3:
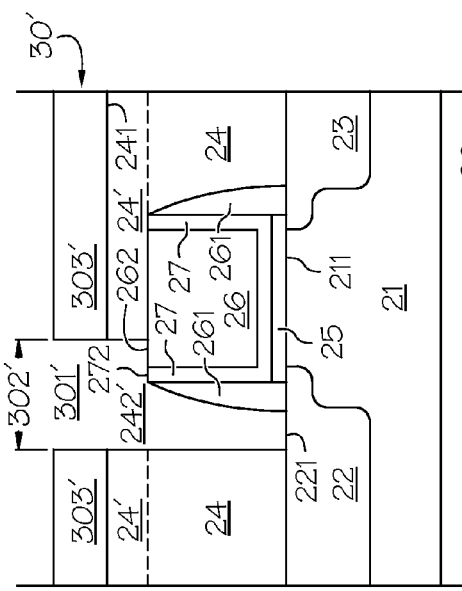

FIGS. 1-4 show simplified cross-sectional views of a semiconductor device or portion of an integrated circuit (IC) embodying FET 20 whose source or drain contact 32 (e.g., see FIG. 4) is intended to be located in close proximity to but insulated from adjacent conductive gate 26, illustrating how contact mis-alignment or other lithographic error can result in unintended short 33 between source or drain contact 32 and gate 26 of FET 20. Referring to FIG. 1, FET 20 is formed on and in semiconductor substrate 21 having upper surface 211. Spaced apart source-drain regions 22, 23 are provided in substrate 21 proximate surface 211. Either of doped regions 22, 23 may serve as source or drain or any other type of underlying semiconductor region to which electrical contact is desired. Overlying surface 211 between spaced-apart source-drain regions 22, 23 are gate insulator 25 of, for example silicon oxide, and gate conductor 26 of, for example, metal or metal-SC alloy or doped semiconductor. Dielectric sidewalls of, for example, silicon nitride, are provided on lateral sides of gate 26. In this example, gate conductor 26 has barrier layer 27 of separating gate conductor 26 from gate insulator 25 and dielectric sidewalls 261. Barrier layer 27 is optional. Dielectric region or layer 24 laterally surrounds gate 26 with sidewalls 261 and optional barrier layer 27. Dielectric region 24 may include portion 24' that overlies gate 26, sidewalls 261 and barrier layer 27. Referring now to FIGS. 2 and 3, in order to make electrical contact to source or drain region 22 (or whatever SC region underlies dielectric 24) opening or passage 242, 242' must be provided through dielectric 24 to surface portion 221 of region 22 of substrate 21.

FIG. 2 illustrates the situation where a correctly sized and aligned contact opening or passage is created. Mask 30 overlying surface 241 of dielectric 24 in FIG. 2, has open portion 301 of lateral width 302 and closed portions 303. Open portion 301 is correctly positioned (i.e., correctly "aligned") and of an appropriate size so that opening or passage 242 may be etched through dielectric 24 to expose portion 221 of underlying SC region 22 without extending laterally to barrier layer 27 and gate 26. When mask 30 is removed and opening or passage 242 filled with conductor, electrical contact is provided to surface 221 of underlying SC region 22, as is desired, without also contacting gate 26.

Figure 4:
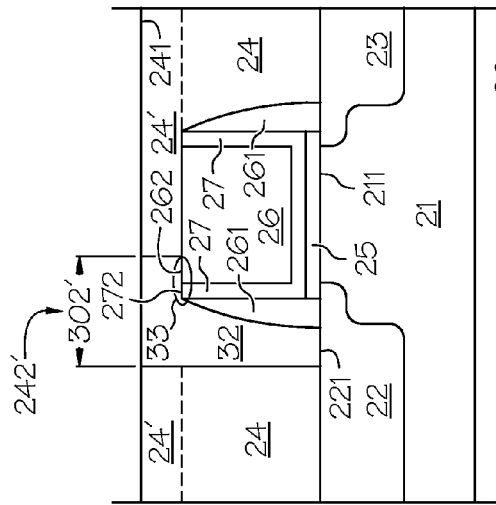

FIG. 3 illustrates the situation where a mis-aligned or mis-sized contact opening is formed. Mask 30' overlying surface 241 of dielectric 24 in FIG. 3 has open portion 301' of lateral width 302' (in this example the same as width 302 of FIG. 2) and closed portions 303'. Open portion 301' is incorrectly positioned (i.e., "mis-aligned") with respect to gate 26 and barrier layer 27. When opening or passage 242' is etched through dielectric 24 to expose portion 221 of underlying SC region 22, opening or passage 242' also extends laterally over gate 26 and barrier layer 27. When mask 30' is removed and opening or passage 242' filled with conductive material as shown in FIG. 4, electrical contact 32 is provided to underlying SC region 22, as is desired, but also to gate 26 and barrier layer 27 via overlapping region 33. Overlapping region 33 creates an electrical "short", i.e., a relatively low resistance path between contact 32 and gate 26. This is not desirable. Electrical short region 33 can come about from mis-alignment of or mis-sizing of mask opening 301, leading to mis-alignment (i.e., mis-placement) of contact opening 242' or mis-sizing if contact opening is larger than desired so that it laps over onto gate 26 and/or barrier layer 27. Either type of defect can lead to the undesirable outcome of an electrical short between contract 32 and gate 26. Persons of skill in the art will understand that such short (i.e., relatively low resistance path) can occur between any type of electrically conductive contact and a nearby electrically conductive device region, and is not limited merely to source or drain regions and gates of FETs.

FIGS. 5-14 show simplified cross-sectional views of a semiconductor device or portion of an IC embodying FET 40 analogous to that of FIGS. 1-4 at various manufacturing stages 505-514, with the same contact mis-alignment or mis-sizing shown in FIG. 3, but where the contact-gate short illustrated in FIG. 4 is avoided, according to an embodiment of the present invention. The same reference numbers are used in FIGS. 5-14 to refer to device regions analogous to those shown in FIGS. 1-4. Accordingly, the discussion in connection with FIGS. 1-4 of the device elements or regions identified by such common reference numbers is incorporated herein by reference. Referring now to manufacturing stage 505 of FIG. 5, device 40 includes substrate 21 having upper surface 211, source or drain regions 22, 23, gate insulator 25, conductive gate 26 having upper surface 262, barrier layer 27, and dielectric sidewalls 261. Gate 26, barrier layer 27, and gate sidewalls 261 are laterally surrounded by dielectric region or layer 34 analogous to layer or region 24 of FIGS. 1-4 but without upper portion 24'. Silicon dioxide and silicon nitride are non-limiting examples of suitable materials for dielectric region or layer 34, but other materials may also be used. Silicon oxide is preferred. Dielectric region or layer 34 has upper surface 341. Structure 605 results.

Referring now to manufacturing stage 506 of FIG. 6, titanium nitride, lanthanum oxide, and aluminum oxide are non-limiting examples of material suitable for use as barrier layer 27, but other materials may also be used or barrier layer 27 may be omitted in further embodiments. Titanium nitride is preferred. Structure 605 is exposed to an etchant to selectively remove portions 271 of barrier layer 27 proximate surfaces 262, 341. The particular choice of etchant will depend upon the particular material chosen for barrier layer 27. Where barrier layer 27 is of titanium nitride, then plasma etching using chlorine and/or oxygen as etchants is a non-limiting example of a suitable process and etchants, but other etching methods and etchants can also be used. Structure 606 results in which upper portion 271 of barrier layer 27 exposed near upper surface 341, 262 of device 40 has been removed.

Referring now to manufacturing stage 507 of FIG. 7, layer 36 is applied over upper surfaces 262, 341 so that portions 361 of layer 36 fill voids 271 in the upper portions of barrier layer 27, and portion 362 of layer 36 overlies the remainder of surfaces 262, 341. Aluminum and titanium are non-limiting examples of useful materials for layer 36, but other materials may also be used. Aluminum is preferred. Structure 607 results. In manufacturing stage 508 of FIG. 8, portion 362 of layer 36 overlying surface 341, 262 is removed, leaving behind portions 361 filling voids 271 of barrier layer 27. Chemical-mechanical polishing (CMP) is a non-limiting example of a suitable means for removing portions 362 of layer 36. Structure 608 results. Where barrier layer 27 is an electrical insulator or omitted, manufacturing stages 506-508 may be omitted.

Figure 9:
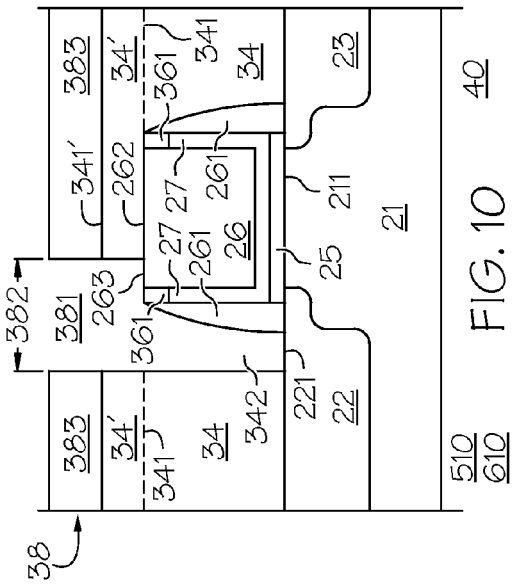

Referring now to manufacturing stage 509 of FIG. 9, dielectric layer 34' having upper surface 341' and thickness 342' is applied over structure 608. In general, layer 34' may be formed from the same materials as layer or region 34. Thickness 342' is usefully in the range of about 20 to 200 nanometers, but thicker and thinner layers may also be used. Structure 609 results. Structure 609 resembles that shown in FIG. 1, but with the important difference that upper portion 271 of barrier layer 27 has been replaced by portion 361 of layer 36. However, if barrier layer 27 is originally an insulating material or formed from the same material as that described for layer 36, then such replacement is not needed.

Figure 10:
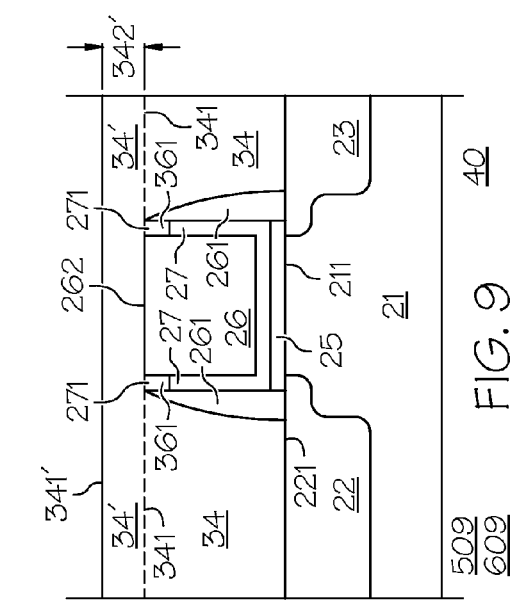
Figure 11:
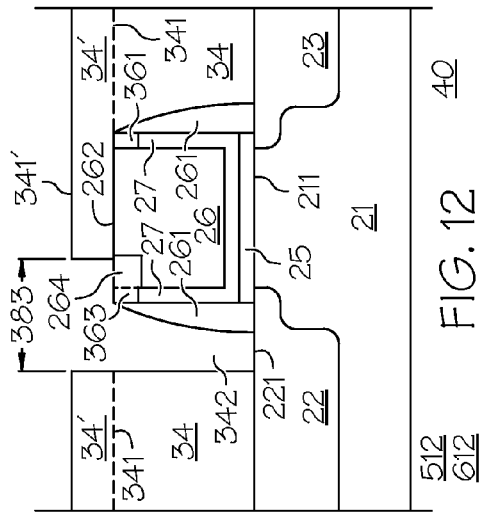

Referring now to manufacturing stage 510 of FIG. 10, mask 38 analogous to mask 30' of FIG. 3 is provided on upper surface 341' of device 40. Mask 38 has open portion 381 of lateral width 382 and closed portion 383. For convenience of explanation, lateral width 382 is presumed to be the same as lateral width 302' of FIG. 3 and with equivalent mis-alignment or mis-sizing. Opening 381 is used to etch opening or passage 342 in dielectric layer 34 extending on the left to surface 221 of semiconductor region 22 of substrate 21, and (because of the mask opening mis-alignment or mis-sizing) on the right to expose portion 361 of barrier layer 27 and upper left portion 263 of conductive gate 26. This is similar to the situation depicted in FIG. 3, wherein etching through layer 24 using mis-aligned mask opening 301 results in exposing not only surface 221 of SC region 22 but also in exposing the upper left portion of gate 26 and barrier layer 27. Structure 610 results. Referring now to manufacturing stage 511 of FIG. 11, portions 383 of mask 38 are removed. Structure 611 results. However, if mask 38 is a hard mask, then manufacturing stage 511 may be omitted and the remains of mask 38 may be left in place. Either arrangement is useful.

Figure 12:
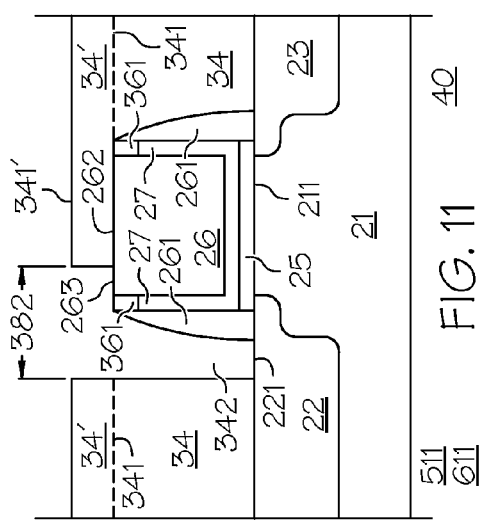

Referring now to manufacturing stage 512 of FIG. 12, at least the parts of device 40 exposed in opening 342 of dielectric layer 34 are subjected to chemical processing to transform exposed portion 263 of gate 26 from a conductor to insulator 264, and where barrier layer replacement portion 361 is also a conductor, to likewise transform portion 361 to insulator 363. For example, where gate 26 and barrier layer replacement portion 361 are of aluminum, then they may be readily converted to dielectric regions 363 and 264 respectively, of for example aluminum oxide or aluminum fluoride. By way of example and not limitation such conversion may be accomplished by exposure to plasma containing oxygen or fluorine gas, or by wet or plasma anodization in suitable reagents. Other reagents and the equivalent of such oxidation or fluoridation processes may also be used. What is desired is that the portion of barrier layer 27 (or barrier layer replacement region 361) and portion 263 of gate conductor 26, exposed in contact opening 342 be converted from conductor to insulator 363, 264.

Even though substrate contact portion 221 and sidewalls 261 are exposed in opening 342 during such conversion process, they are substantially unaffected by the conversion process because they are of semiconductor and/or dielectric materials that are generally insensitive to such conversion process. For example and not intended to be limiting, where sidewalls 261 are of silicon nitride or other dielectric, they are substantially unaffected by formation of dielectric region 264. Further, SC contact portion 221 is typically of silicon, nickel-silicide, silicon-carbide, silicon-germanium or other semiconductor. Such materials do not readily form dielectric fluoride compounds and are therefore substantially unaffected by the conversion of portion 361 that has replaced upper portion 263 of barrier layer 27 (if present) and portion 263 of conductor 26 to, for example, insulating fluoride region 264. Similarly, if oxygen is used in the conversion process, the materials of contact portion 221 will react much more slowly than the materials of regions 263, 361, and any oxide that forms on contact portion 221, may be readily removed, for example by a brief HF dip etch, without significantly attacking dielectric region 264, 363. Structure 612 results.

Figure 13:
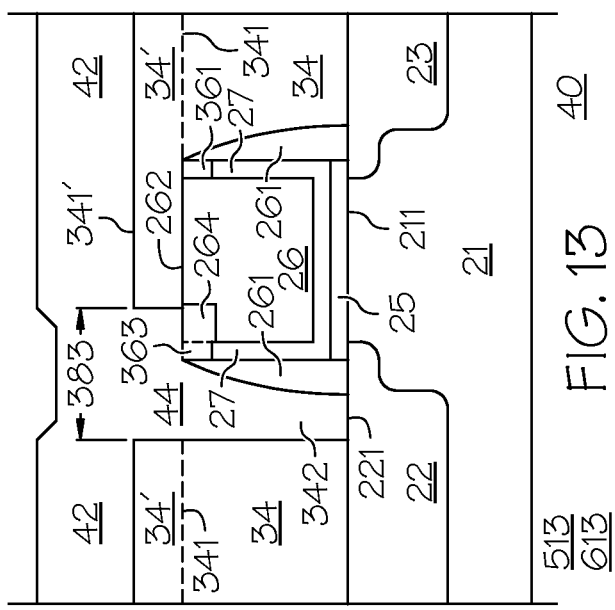

Referring now to manufacturing stage 513 of FIG. 13, conductor layer 42 is applied over surface 341' and to fill through-opening or passage 342 so that contact portion 44 of layer 42 makes Ohmic or other electrical contact to portion 221 of underlying SC region 22 (or whatever SC region underlies opening 342) of substrate 21. Even though contact portion 44 also extends partly over gate 26 and barrier layer 27, the presence of dielectric regions 363 and 264 underlying overlap region 39 precludes conductor 44 from shorting to gate 26 and barrier layer 27 (if conductive). Structure 613 results.

Figure 14:
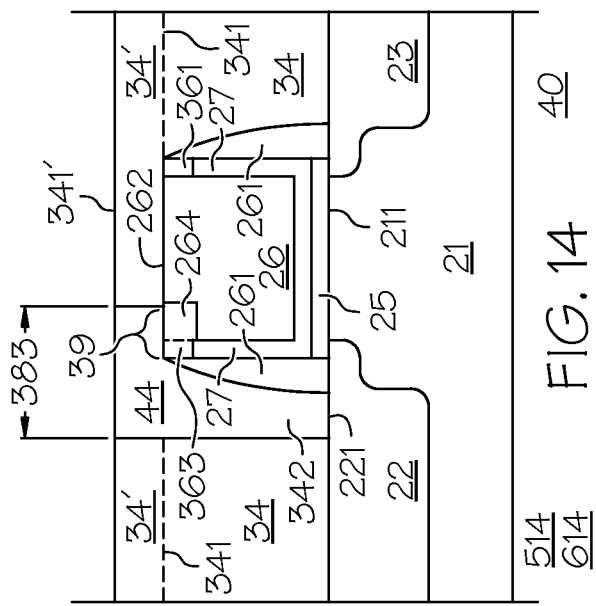

In manufacturing stage 514 of FIG. 14, structure 613 is desirably planarized (e.g., using CMP) to re-expose surface 341' of dielectric layer or region 34', leaving contact 44 in opening or passage 342 making electrical connection to underlying SC portion 221 of SC region 22 of substrate 21. Structure 614 results. Thus, the desired objective is achieved of being able to provide a short-free alignment tolerant electrical contact (e.g., contact 44) to an underlying SC or other substrate region (e.g., region 22) even though contact 44 is so closely spaced to gate or other nearby conductor or device region 26 that mis-alignment, mis-sizing or other lithographic error may create overlap therebetween. This is very useful and of great practical significance.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A method for forming an alignment tolerant electrical contact to a contact region of an underlying substrate, comprising:
   providing a substrate having thereon a first electrically conductive region with an upper surface, wherein the conductive region is laterally bounded by a first dielectric region;
   applying a mask over the first dielectric region and the upper surface, the mask having an opening extending partly over the contact region and over a part of the upper surface;
   removing a portion of the first dielectric region underlying the mask opening to form a passage through the first dielectric region extending to the contact region and the part of the upper surface, thereby exposing the contact region and the part of the upper surface;
   converting the part of the upper surface to a second dielectric region; and
   filling the passage with a conductor making electrical contact with the contact region and making contact with the second dielectric region and electrically insulated thereby from the electrically conductive region.

2. The method of claim 1, further comprising forming dielectric sidewall spacers on the first conductive region located between the dielectric region and the first electrically conductive region.

3. The method of claim 2, wherein the opening extends across a part of the dielectric sidewall spacers.

4. The method of claim 2, further comprising forming a barrier layer laterally surrounding the first electrical conductor between the first electrical conductor and the dielectric sidewall spacers.

5. The method of claim 4, wherein the barrier layer is an electrical conductor, the method further comprising prior to the step of applying a mask, replacing an upper part of the barrier layer with another material.

6. The method of claim 5, wherein the another material is an electrical conductor and the method further comprises, converting the another material to a third dielectric region.

7. The method of claim 6 wherein converting the another material occurs at substantially the same time as converting the part of the upper surface to a second dielectric region.

8. The method of claim 7, wherein the second dielectric region comprises an aluminum containing dielectric.

9. The method of claim 8, wherein the third dielectric region comprises an aluminum containing dielectric.

10. The method of claim 4, wherein the barrier layer is a dielectric material.

11. The method of claim 5, wherein the another material is a dielectric material.

12. A method for forming an integrated circuit having a field effect transistor (FET), comprising:
    providing a semiconductor containing substrate over which is a FET gate laterally bounded by a first dielectric region, wherein the FET gate has an upper surface;
    applying a mask having an opening extending partly over a source or drain contact region of the substrate and over a part of the upper surface of the FET gate;
    forming an opening through the first dielectric region extending to the contact region and the part of the upper surface, thereby exposing the contact region and the part of the upper surface;
    converting the part of the upper surface to a second dielectric region; and
    filling the opening with a conductor making electrical contact with the contact region but electrically insulated from the FET gate by the second dielectric region.

13. The method of claim 12, wherein the FET gate is laterally enclosed by a barrier layer between the FET gate and the first dielectric region, and further comprising prior to applying the mask, replacing an upper portion of the barrier layer with a third dielectric region.

14. The method of claim 13, wherein replacing an upper portion of the barrier layer with a third dielectric region, comprises:
    replacing the upper portion of the barrier layer with a conductor material; and
    converting the conductor material to the third dielectric material.

15. The method of claim 14, wherein converting the conductor material to the third dielectric material is accomplished substantially during the same manufacturing stage as converting the part of the upper surface to the second dielectric region.

16. The method of claim 15, wherein converting the part of the upper surface to the second dielectric region is accomplished by a plasma reaction.

* * * * *